United States Patent [19]
McClure

[11] Patent Number: 5,337,273
[45] Date of Patent: Aug. 9, 1994

[54] CHARGE SHARING FLASH CLEAR FOR MEMORY ARRAYS

[75] Inventor: David C. McClure, Carrollton, Tex.

[73] Assignee: SGS-Thomson Microelectronics, Inc., Carrollton, Tex.

[21] Appl. No.: 100,084

[22] Filed: Jul. 30, 1993

[51] Int. Cl.⁵ .................... G11C 7/00; G11C 11/413
[52] U.S. Cl. .................... 365/168; 365/189.01; 365/184.09; 365/190; 365/202; 365/203; 365/204; 365/227
[58] Field of Search ............ 365/168, 189.01, 189.11, 365/189.09, 190, 202, 203, 204, 227, 230.06

[56] References Cited

U.S. PATENT DOCUMENTS

| | | | |
|---|---|---|---|
| 4,639,898 | 1/1987 | Saver | 365/202 |
| 4,901,279 | 2/1990 | Plass | 365/227 |
| 4,901,284 | 2/1990 | Ochii et al. | 365/189.11 |
| 5,003,510 | 3/1991 | Kamisaki | 365/189.05 |
| 5,025,365 | 6/1991 | Mathur et al. | 364/200 |

Primary Examiner—Eugene R. LaRoche
Assistant Examiner—Tan Nguyen
Attorney, Agent, or Firm—Kenneth C. Hill; Lisa K. Jorgenson; Robinson, Richard K.

[57] ABSTRACT

A static random access memory provides interconnection of local wordlines and bit lines to share charge during bulk write operations. Prior to a bulk write cycle, a bit line for each memory cell is driven to a first voltage level. Subsequently, the bit lines and the local wordlines are interconnected for sharing charge between the bit lines and the local wordlines. Next, the bit lines are disconnected from the local wordlines and the bit lines are driven to a second voltage level while the local wordlines are driven to the first voltage level to address the memory cells. Then the bit lines and local wordlines are reconnected to distribute charge from the local wordlines to the bit lines. Lastly, the bit lines are again disconnected from the local wordlines and driven to the first voltage level preparatory to resuming normal operation.

22 Claims, 3 Drawing Sheets

CHARGE SHARING FLASH CLEAR FOR MEMORY ARRAYS

BACKGROUND OF THE INVENTION

1. Field of the Invention

The invention relates to random access memory (RAM) integrated circuits, and more particularly to static RAM (SRAM) circuits providing a flash write or clear feature with minimum power consumption.

2. Description of the Prior Art

SRAMs hold advantages in speed and lack of power demand over comparable capacity dynamic random access memories (DRAMs). Memory cells in SRAMs are based on latches instead of capacitors as in DPJuMs. Capacitors dissipate a charge (corresponding to a bit of data) over time and thus require periodic refresh. Refresh requires power. Reading and writing to a capacitor based memory device requires both time and power. Thus, SRAMs have been advantageously used in applications requiring high speed operation (e.g. cache memory for personal computers), low power consumption (e.g. portable computers powered by batteries), or both. Complementary metal oxide semiconductors (CMOS) SRAM exhibit particularly low operating power requirements. In addition, SRAM Integrated circuits are simpler than competing dynamic RAMs because complex circuitry for clocks and refresh operations required by competing dynamic random access memories may be dispensed with. Thus SRAMs have been favored where the improved performance justifies their greater expense, or in basic electronic components where design cost to handle refresh is unjustified.

Memory cell densities achieved with DRAMs have not been matched in SRAMs and are not likely to do so in the future. An SRAM memory cell will typically include from four to six transistors, as compared to one transistor and a capacitor for a DRAM. Thus an SRkM having comparable capacity to a DRAM, when fabricated with comparable techniques, is physically larger. Large relative size compromises to some extent the advantages described above for SRAMs. As SRAMs of increased capacity have been designed they have been made physically larger. Size contributes to increased operating power requirements and reduced operating speed.

A feature of SRAM architecture are wordlines, which are used to address particular memory cells, and bit lines over which data are written and read. As SRAMs increase in size, wordlines and bit lines have become longer and more memory cells have been addressed and accessed, resulting in increased capacitance of the lines. Increased capacitance affects both for power requirements and timing, particularly for an operation called flash clear.

Flash clear (sometimes called flash write) is of particular utility in SkAMs utilized in computer cache memories. A computer cache memory duplicates selected data from main memory allowing a computer CPU faster access to that data than can be obtained from main memory, constructed from cheaper DRAMS. The protocol for selection of the data to be duplicated is critical to the effective operation of a cache. The flash clear operation can be used to clear all resident data from SRAMs of the cache, such as in tag arrays or data storage, where a selection protocol requires such an operation.

Flash clear results in relatively large currents on an SRAM. Current transients may be in the range of amperes, bordering on capacity limitations of the devices involved. In proposed SRAMs, a single wordline can have a capacitance of 230 femtofarads (fF). With 128 rows of memory cells, requiring 128 wordlines, each block has a wordline capacitance of approximately 29.5 picofarads. The device has 8 blocks so total wordline capacitance is about 240 pF. Bit line capacitance is 470 fF, for each of the two bit lines to a cell. Only one bit line, typically the bit line complement, is used for the flash clear operation. With 64 columns per block, capacitance for a block is 30 pF. Totalling capacitance over 8 blocks gives a total bit line capacitance of 240 pF.

To perform a flash clear all the wordlines are raised and the bit line complements are pulled to ground. Then, to terminate the bulk write, the bit line complements are returned to $V_{cc}$ and the wordlines lowered. The total amount of capacitance charged from $V_{cc}$ or discharged to $V_{ss}$ is 480 pF. Over a 10 nanosecond cycle the average current i would be:

$$i = c\Delta v/\Delta t = 480\ pF\ (5.5\ v)/10\ nS = 264\ mA.$$

Lengthening the cycle can reduce average current, but it must be recognized that capacitor charging and discharging is not constant. Further, lengthening flash clear cycle time is undesirable from a performance point of view. Transient currents during the flash cycle are quite large, additionally contributing to large IR (current times resistance) losses.

SUMMARY OF THE INVENTION

It is an object of the invention to provide an SRAM circuit providing flash write with minimal power consumption.

It is an object of the present invention to provide a system and method in a random access memory circuit of sharing charge between a bit line and a wordline during a flash clear operation.

It as another object of the present invention to provide an SRAM having reduced maximum current transients during flash clear.

A static random access memory includes a plurality of memory cells, arrayed in rows and columns. A memory cell is addressed along a local wordline to a row of memory cells. Data is read into and out of bit line pairs, which are connected in pairs to columns of memory cells. Each local wordline may be selectively connected to at least one of each pair of bit lines over a charge distribution line. The charge distribution line is connected between a bit line from each pair of bit lines and local wordline by first and second switches. The bit line is also connected by a third switch to a voltage level corresponding to logic zero and by a fourth switch to a voltage level corresponding to logic one.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

Figure 1:
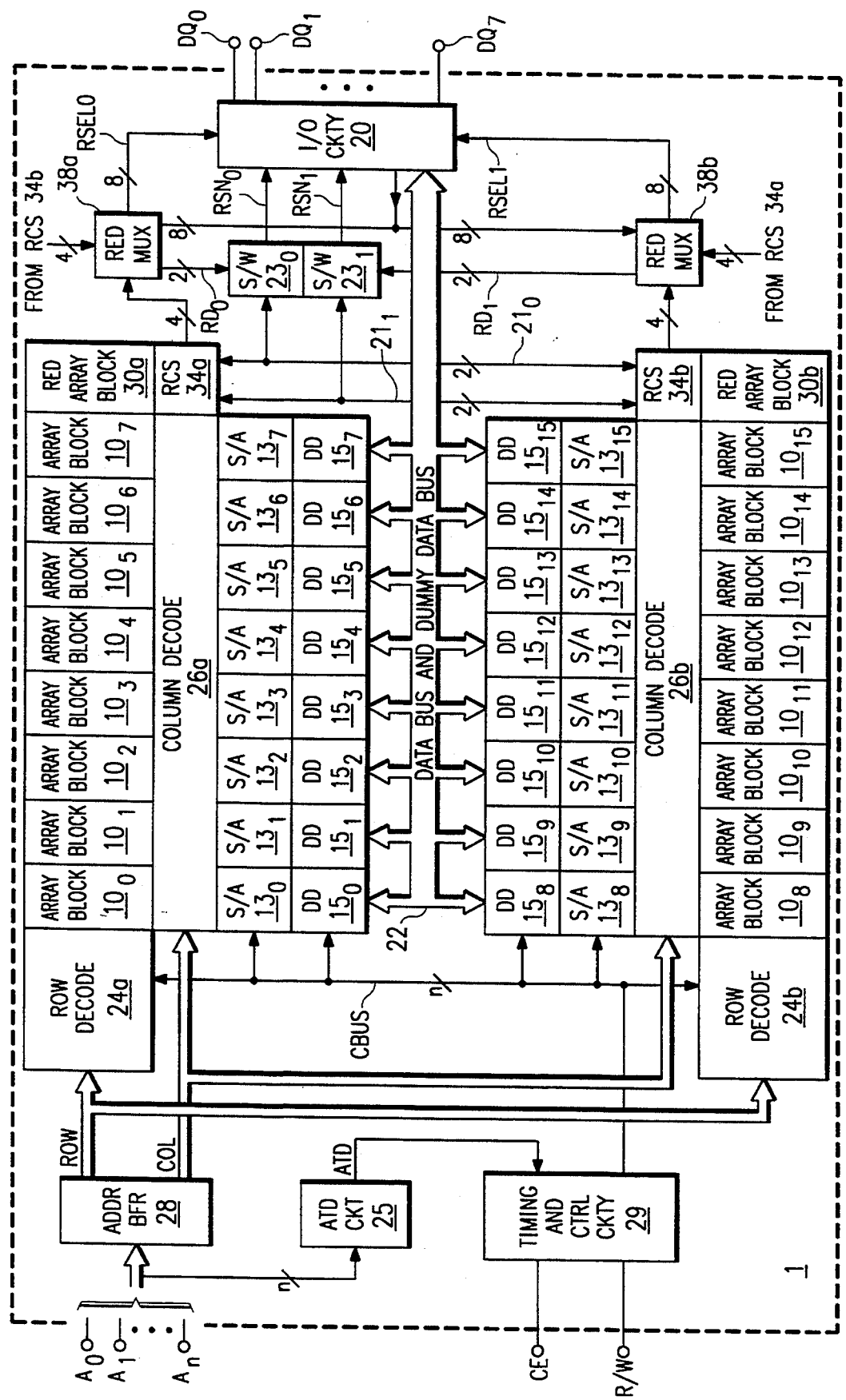
FIG. 1 is a block diagram of a static random access memory.

FIG. 1 illustrates an example of an integrated circuit (IC) memory 1 into which a preferred embodiment of the invention may be implemented. IC memory 1 is a static random access memory (SRAM) of otherwise conventional architecture, having its memory cells in multiple blocks 10 which are shown in their physical location in IC memory 1.

Memory cells in IC memory 1 are arranged in rows and columns. It should be noted that the designation of rows and columns in memory 1 use the term row to refer to the array direction in which a plurality of memory cells are selected by way of a wordline. In conventional memories, each of the memory cells in the selected row are generally coupled to one or a complementary pair of bit lines. The term column is used in this description to refer to the array direction in which one or more of the memory cells in the selected row are selected for read or write access. In conventional memories, this is generally accomplished by coupling one of the bit lines to a sense amplifier/write circuit, or to an internal data bus. It is contemplated that such use of the terms and columns is consistent with the general understanding in the art.

Address terminals $A_o$ through $A_n$ receive an address signal according to which the memory cells to be accessed are designated. In the conventional manner, address terminals $A_o$ through $A_n$ are connected to address buffers 28, which buffer the received address signal and communicate a portion of the address signal to row decoders 24a, 24b on bus ROW, and communicate the remainder to column decoders 26a, 26b on bus COL. Row decoders 24a, 24b select a row of memory cells by enabling the selected wordline in the conventional manner, and in this example are located along a side of the memory array blocks 10. Column decoders 26a, 26b, in this example, select eight memory cells in the selected row to be sensed by a sense amplifier 13 according to the column portion of the address.

In memory 1 the memory cells are grouped into sixteen primary array blocks $10_0$ through $10_{15}$. The number of array blocks 10 may, of course, vary from implementation to implementation. This partitioning of the memory into sixteen primary array blocks 10 is particularly beneficial in low power memories, such as may be used in portable computers, as only the block 10 in which the selected memory cells are located need be enabled during a cycle. In this example, each primary array block 10 includes 64 columns. Selection of the block may be done according to one of the row address bits (indicating upper or lower half) and to four of the column address bits (indicating one of sixteen primary array blocks 10 to be selected).

Alternatively, selection of a row within one of said primary array blocks 10 may be made by way of a global wordline generated by row decoders 24a, 24b, extending across those primary array blocks 10 for which it is operable. Pass gates by which memory cells within each of primary array blocks 10 are connected to their bit lines are, in this alternative arrangement, controlled by local wordlines which extend only within each primary array block 10 for each row portion therein. In this arrangement, pass transistors connected between each global wordline and the local wordlines are enabled according to a block portion of the column address, so that only the local wordline associated with the primary array block 10 selected by the column address is enabled, thus reducing the active power dissipation of each memory cycle. An example of such an arrangement is described in Sakurai, et al., "A Low Power 46 ns 256 kbit CMOS Static RAM with Dynamic Double Word Line", *IEEE J. Solid State Circuits*, Vol. SC-19, No. 5 (IEEE, Oct. 1984), pp. 578–585.

Memory 1, as in the case of most modern SKAMs and DRAMs, includes some amount of dynamic operation, such as precharging and equilibration of certain nodes (e.g., bit lines) at particular points in the memory cycle. Initiation of the cycle in memory 1 occurs by way of address transition detection, performed by address transition detection (ATD) circuit 25. ATD circuit 25 is connected to each of the address inputs $A_o$ through $A_n$, preferably prior to address buffers 28 (as shown), and generates a pulse on line ATD responsive to detecting a transition at any one or more of address inputs $A_o$ through $A_n$; such a pulse is useful in controlling the internal operation of memory 1 in the conventional manner.

Other internal operational functions are controlled by timing and control circuitry 29, which receives the signal on line ATD from ATD circuit 25, and which also receives certain external control signals such as the chip enable signal at terminal CE, and the read/write select signal at terminal R/W. Timing and control circuitry 29 generates various control signals based on these inputs, for control of the various functions within memory 1 in the conventional manner. As shown in FIG. 1, control bus CBUS is connected to sense amplifiers 13 and data drivers 15; other functions are similarly controlled by timing and control circuitry 29 in the conventional manner, with their connections not shown in FIG. 1 for purposes of clarity.

Memory 1 in this example is of the byte-wide type, and as such it has eight input/output terminals $DQ_0$ through $DQ_7$ at which output data is presented during a read operation, and at which input data is received during a write operation. Input/output circuitry 20 is connected between data bus 22 and terminals DQ, and includes conventional input and output buffers connected thereto.

Each of primary array blocks $10_0$ through $10_{15}$ is associated with a corresponding group of sense amplifiers $13_0$ through $13_{15}$, as shown in FIG. 1. In this example, eight individual sense amplifiers 13 are included within each group of sense amplifiers $13_0$ through $13_{15}$, one sense amplifier 13 for each of the eight bits to be communicated on internal data bus 22 from the selected one of primary array blocks $10_0$ through $10_{15}$. Groups of data drivers $15_0$ through $15_{15}$ are each associated with a corresponding group of sense amplifiers $13_0$ through $13_{15}$ for receiving the data signal therefrom and for driving internal data bus 22 therewith; individual data drivers 15 are associated with individual sense amplifiers 13 in each group, one data driver 15 for driving each line in data bus 22.

The memory array is also divided into halves, with primary array blocks $10_0$ through $10_7$ in one array half and primary array blocks $10_8$ through $10_{15}$ in the other half. Internal data bus 22 runs the length of the array halves, and is located therebetween as shown in FIG. 1. In this example, data bus 22 includes eight data conductors, each associated with an input/output terminal $DQ_0$ through $DQ_7$ and coupled thereto via input/output circuitry 20. Each individual data conductor is connected to a corresponding data driver 15 in each of the sixteen data driver groups $15_0$ through $15_{15}$ of the sixteen primary array blocks $10_0$ through $10_{15}$. For a read/write memory such as memory 1, a separate input data bus can be used to communicate input data to be written to the selected memory cells, in the conventional manner. Alternatively, the input data may also be communicated along data bus 22, as is conventional for some memory designs.

In this example, data bus 22 also preferably includes eight dummy data conductors, each of which are also connected to a corresponding data driver 15 in each of the sixteen data driver groups $15_0$ through $15_{15}$ of the sixteen primary array blocks $10_0$ through $10_{15}$, for purposes of precharging data bus 22 by way of charge sharing. Each of these dummy data conductors preferably physically resembles one of the true data conductors, preferably having substantially the same length and cross-sectional area and being formed of the same material, and is maintained, at all times, at a complementary state relative to its true data conductor.

Figure 2:
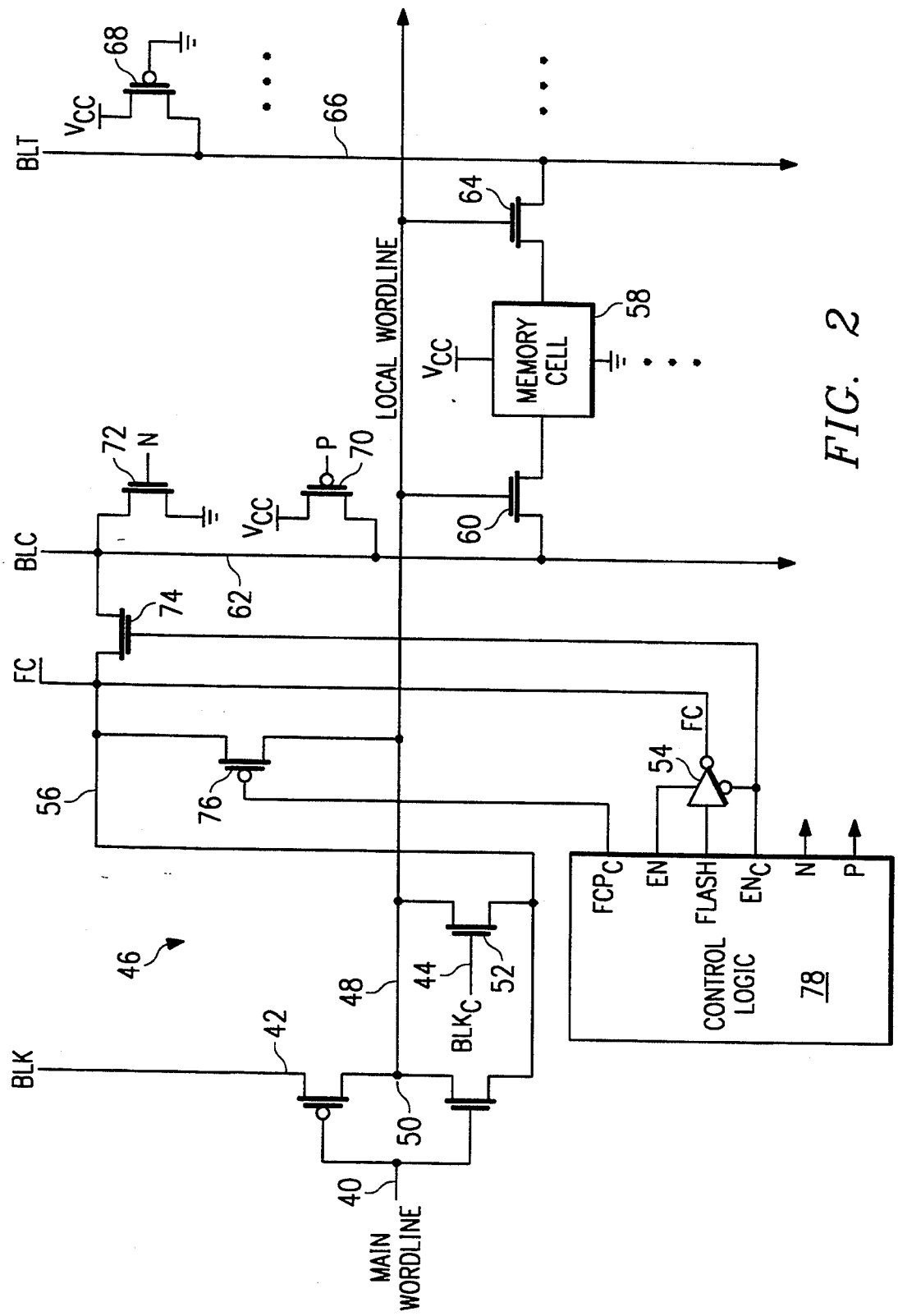
FIG. 2 is a partial circuit schematic of an SRAM.

FIG. 2 is a partial circuit schematic of memory 1 depicting decoding circuitry, local wordlines, bit line complements and bit line trues for one of a plurality of memory cells. A main wordline 40, a block decode line 42 and a complementary block decode line 44 provide inputs to a local decoder 46 in a conventional manner. Local decoder 46, in normal operation, applies a high or low logic level signal to local wordline 48 to turn on and off gating transistors for access to memory cells in a row. Local decoder 46 includes a CMOS inverter 50 to which the signal on the main wordline is applied as a control or gating signal and which is connected between the block decode line 42 and a flash clear or charge distribution line 56. A pull-down transistor 52 controlled by the complementary block signal $BLK_c$ is connected between local wordline 48 and charge distribution line 56. The block (BLK), complementary block $BLK_c$ and main wordline signals are provided by the circuitry described above in connection with FIG. 1.

In normal operation, charge distribution line 56 is held near $V_{ss}$ (typically ground) by tristateable driver 54. In the absence of a high block activation signal BLK, $BLK_c$ will drive transistor 52 into conduction to keep local wordline 48 at a low logic value. Memory cells connected in the row addressed by local wordline 48 will remain isolated from their respective bit lines.

For the sake of simplicity in description, the invention is described with respect to a single memory cell 58, although it will be understood by those skilled in the art that memory cell 58 is part of an array of rows and columns of identical memory cells. Memory cell 58 is a conventional static random access memory memory cell connected between $V_{cc}$ and ground and operating as a latch for storing a single bit of data. As is conventional, memory cell 58 is connected by a gating transistor 60 to a bit line complement 62 and by a gating transistor 64 to a bit line true 66. Bit line complement 62 and bit line true 66 have static loads during normal operation. For bit line true, the static load is represented by a P-channel transistor 68 the gate of which is connected to ground or $V_{ss}$. Transistor 68 is connected between bit line true 66 and source of $V_{cc}$. Similarly, transistor 70 provides a static load to bit line complement 62. Transistor 70 is a P-channel device connected between $V_{cc}$ and bit line complement 62. However, unlike transistor 68 the gate of transistor 70 is connected to a control signal P, which in normal operation is held at ground or $V_{ss}$, but can be driven high. In addition, a second transistor 72, here an N-channel device, is connected between bit line complement 62 and ground and is controlled by a gating control signal N. As will be described in more detail below transistor 70 and 72 can be used to establish the voltage level of a signal BLC on bit line complement 62 of $V_{cc}$ or $V_{ss}$ as required by flash clearing operation. BLC may be gated to flash clear line 56 by an N-channel transistor 74. Alternatively, gate 74 may be a full CMOS transmission gate in lieu of an N-channel device. N-channel transistor 74 is controlled by a logic signal $EN_c$. Charge distribution line 56 is also connected by a P-channel transistor 76 to local wordline 48. P-channel transistor 76 is controlled by a logic signal $FCP_c$.

Control logic 78 provides the various control signals $FCP_c$, $EN_c$, N and P, as well as two additional control signals EN and FLASH which, with $EN_c$, are used to control tristateable driver 54. The output of tristateable driver 54 is a logic signal FC. The output of driver 54 is connected directly to charge distribution line 56 and to the source of transistor 52 and the ground terminal of CMOS inverter 50.

In cache systems flash clear is typically used in the tag array to clear all entry valid bits among the tags. However, the invention can be extended to potentially all of the bit and wordlines in an IC memory.

Although only one bit line pair, 62 and 66, is shown, all bit lines in a block (or even the entire array) would be tied to charge distribution line 56 through their respective gates 74. Each block could however have its own flash clear line 56 to allow staggering of operation of the flash clear operation to further reduce current transients.

Figure 3:
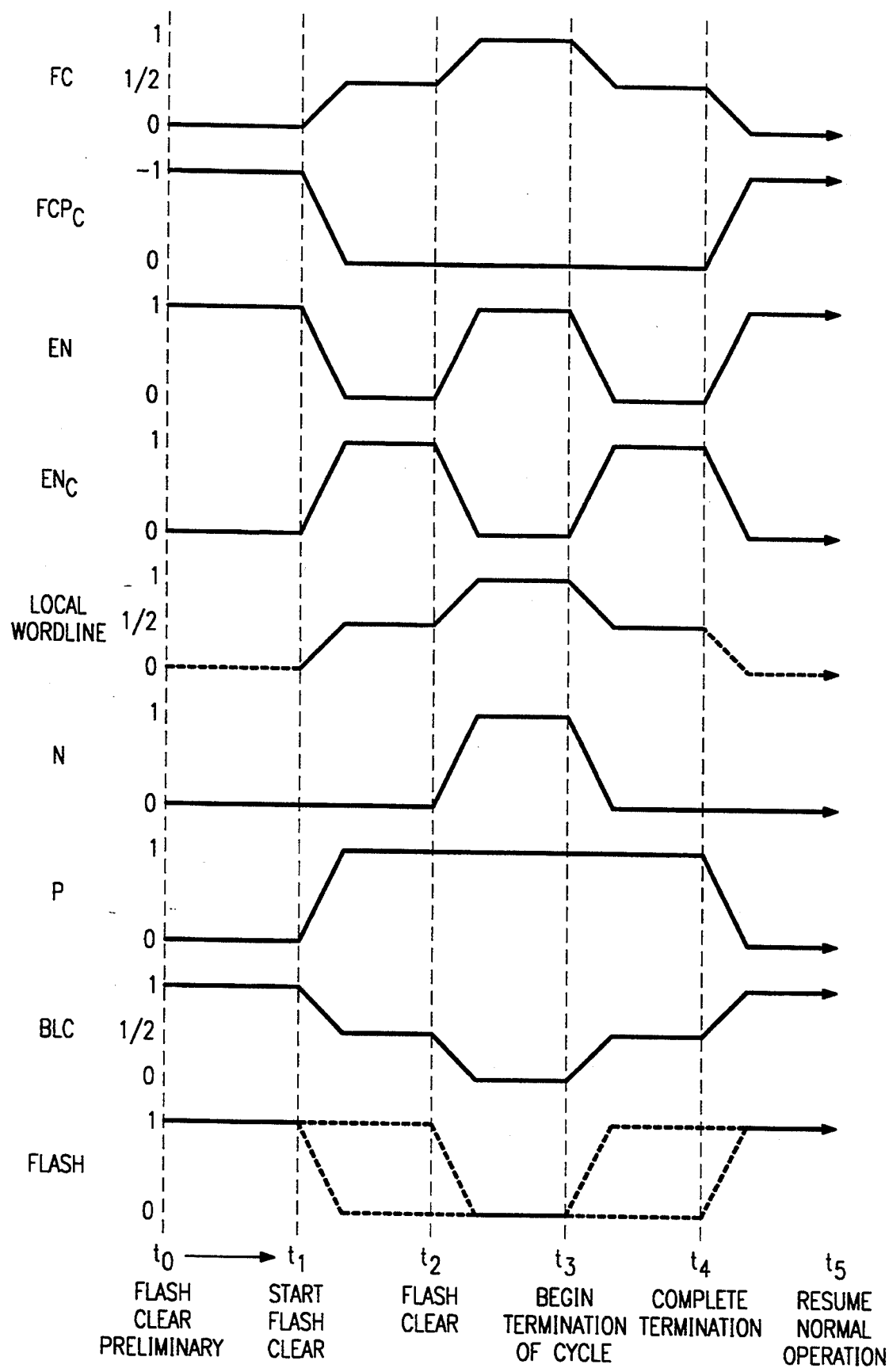
FIG. 3 is a timing diagram.

The operation of the circuit of FIG. 2 will now be described with reference to the timing chart of FIG. 3. A flash clear operation begins with the termination of normal operations at time zero and may be considered to include five periods. The periods are a preliminary flash clear period, a start flash clear period, flash clear, a begin of termination of flash clear and a completion of termination of flash clear. The middle three periods are the essential steps of the operation. The first and last periods are transition stages to and from normal operations. During the preliminary flash clear period at $t_o$, control logic 78 provides the Flash control signal at logic 1, a P control signal at logic 0, an N control signal at logic 0, an $EN_c$ control signal at logic 0, an EN control signal at logic 1 and an $FCP_c$ control signal at logic 1. The BLK, $BLK_c$ and main wordline signals are not of interest. As a consequence of the state of the above logic signals, FC, the signal appearing on charge distribution line 56 is at logic 0 (e.g. $V_{ss}$). The values of flash, EN and $EN_c$ set the tristateable driver at a low output impedance and charge distribution line 56 discharges to about $V_{ss}$. The signal on a local wordline 48 is indeterminate but is shown at logic 0. The value of the signal BLC on the bit line complement 62 is at logic 1 because transistor 70 is conducting and transistor 72 is in cut-off as a result of the state of the signals P and N, respectively.

In this example, the bit line loads 68 and 70 act as static loads, although different types of loads could be used. The local decoder acts as a pseudo NOR gate decoder. At time $T_1$, or the start of flash clear, control logic 78 drives control signal P to logic 1 and reverses the states of control signals EN and $EN_c$ to 0 and 1, respectively. Control signal N remains unchanged and the value of Flash may remain unchanged. The tristateable driver now exhibits a high output impedance to charge distribution line 56. In addition, control signal $FCP_c$ has been changed from logic 1 to logic 0. As a result of the logic level changes in $EN_c$ and $FCP_c$, gates 74 and 76 are driven into conduction, shorting bit line complement 62 to local wordline 48 via distribution line 56. All the bit line complements 62 and local wordlines 48 of a block, and possibly in an array, may be shorted together by this step. Meanwhile transistor 70, connecting the bit line complement 62 to $V_{cc}$, has been driven into cut-off, resulting in the charge on the bit line complement being distributed to the local wordlines 48. The distribution of charge among the bit line complement 62 and local wordlines 48 is represented by signals FC, local wordline and BLC assuming a value of one half. The source of the charge on the bit line complements is the capacitance effects previously described.

At time period $T_2$, control logic 78 again reverses the logic levels of outputs control signals EN and $EN_c$ and, in addition, drives control signal N to logic 1. As a result, transistor 74 is driven into cut-off isolating the bit line complement 62 from the charge distribution line 56. However, transistor 76 remains in conduction. In addition the flash control signal from control logic 78 to tristateable driver 54 is now driven to logic level 1 resulting in control signal FC being driven to logic 1 with tristateable driver 54 now having a low output impedance. When control signal N is high, bit line complement 62 is connected to ground and assumes a value of logic 0. The local wordline is driven to logic 1, driving memory cell gates 60 and 64 into conduction and connecting memory cell 58 to bit line complement 62, which is at logic 0.

At time period $T_3$, termination of the flash clear cycle begins. Logic signal EN goes low and logic signal $EN_c$ goes high. Logic signal N goes from high to low and the other signals remain unchanged or are at "don't care" levels, as in the case of flash (shown by broken lines). Again gate 76 and 74 are both in conduction and bit line complement 62 shorted to local wordline 48. In this case charge is distributed from local wordline 48 back to bit line complement 62. Because control signal N is low and P is high bit line complement 62 is isolated both from ground and $V_{cc}$. As a consequence, the local wordline 48 and bit line complement 62, as well as charge distribution line 56 are represented as assuming an intermediate logic level associated with the distribution of charge.

At time period $T_4$, termination of the flash clear operation is completed. Control logic 78 returns $FCP_c$ to logic 1, EN to logic 1, $EN_c$ to logic 0, P to logic 0 and Flash to logic 1. Charge distribution line 56 again exhibits a low output impedance and signal FC is at logic 0. This returns control of local wordline 48 to local decoder 46. Gate 74 and 76 are in cut-off. Transistor 70 is on driving BLC on bit line complement 62 to logic 1. The value of the signal on local wordline is determined by the block and main wordline levels. At time period $T_5$ normal operation may be resumed.

By recognizing that both the initiation and termination of a flash clear operation involves charging and discharging potentially closely matched capacitances at about the same time, the invention provides for avoiding wasting energy. Bit lines and wordlines are no longer independently charged and discharged to $V_{cc}$ and $V_{ss}$, respectively, but have charge shared between them. Where capacitances between bit and wordlines are balanced, this results in reducing peak and average currents by one half, if not more in the case of transients.

While the invention has been particularly shown and described with reference to a preferred embodiment, it will be understood by those skilled in the art that various changes in form and detail may be made therein without departing from the spirit and scope of the invention.

What is claimed is:

1. A random access memory, comprising:
   a plurality of memory cells, arrayed in rows and columns;
   a wordline for addressing each row of memory cells;
   a pair of bit lines for transfer of data into and out of each memory cell in a column;
   a charge distribution line for carrying charge between at least a first bit line from a pair of bit lines and a wordline;
   a first switch for selectively connecting the charge distribution line to the first bit line;
   a second switch for selectively connecting the charge distribution line to the wordline;
   a third switch for selectively connecting the first bit line to a voltage source representing logic one; and
   a fourth switch for selectively connecting the first bit line to a voltage source representing logic zero.

2. A random access memory as set forth in claim 1, and further comprising:
   a tristateable driver connected to the charge distribution line for controlling voltage on the charge distribution line and for controlling output impedance exhibited to the charge distribution line.

3. A random access memory as set forth in claim 2, and further comprising:
   control logic for generating control signals for driving the first, second, third and fourth switches and the tristateable driver.

4. A random access memory as set forth in claim 3, wherein the first, second, third and fourth switches are transistors.

5. A random access memory as set forth in claim 4, wherein the random access memory is a static random access memory.

6. A random access memory as set forth in claim 2, further comprising:
   a plurality of blocks of memory cells; and
   a block decoder responsive to a block select signal level comprising a transistor gate connected between the wordline and the charge distribution line.

7. A random access memory as set forth in claim 6, and further comprising:
   a main wordline;
   a main wordline decoder responsive to a select signal for applying a block select level to a wordline; and
   the main wordline decoder including an inverter connected between a source of a second block select level and the charge distribution line.

8. In a static random access memory including a plurality of memory cells, each memory cell being addressed along a wordline and accessed after being addressed on a bit line, a method of clearing the memory cells comprising the steps of:
   during a first period driving a bit line for each memory cell to a first voltage level;

during a second period interconnecting the bit lines to wordlines for sharing charge between the bit lines and the wordlines; and during a third period disconnecting the bit lines from the wordlines, driving the bit lines to a second voltage level and driving the wordlines to the first voltage level.

9. A method as set forth in claim 8, and further comprising:

during a fourth period reconnecting the bit lines and wordlines to distribute charge; and during a fifth period disconnecting the bit lines from the wordlines and driving the bit lines to the first voltage level.

10. A method as set forth in claim 9, wherein the first voltage level is $V_{cc}$ and corresponds to logic one and the second voltage level is $V_{ss}$ and corresponds to logic zero.

11. A method as set forth in claim 8, wherein the first period occurs prior to beginning flash clear, the second period corresponds to beginning of flash clear and the third period corresponds to flash clearing of the memory cells.

12. A method as set forth in claim 9, wherein the first period occurs prior to beginning flash clear, the second period corresponds to beginning of flash clear, the third period corresponds to flash clearing of the memory cells, the fourth period occurs immediately after flash clearing of the memory cells and the fifth period terminates a flash clear cycle and immediately precedes return to normal operation.

13. A static random access memory comprising:
a plurality of memory cells;
a plurality of wordlines for addressing the plurality of memory cells;
bit lines for transfer of data into and out of the memory cells after being addressed;
means for driving a bit line for each memory cell to a first voltage level;
means for connecting the bit lines to wordlines for sharing charge between the bit lines and the wordlines; and
means for disconnecting the bit lines from the wordlines and for driving the bit lines to a second voltage level and the wordlines to the first voltage level.

14. A static random access memory as set forth in claim 13, and further comprising:
means for reconnecting the bit lines and local wordlines to distribute charge after the bit lines have been driven to the second voltage level and the wordlines have been driven to the first voltage level; and
means for disconnecting the bit lines from the wordlines and driving the bit lines to the first voltage level after reconnection has been completed.

15. A static random access memory as set forth in claim 14, wherein the first voltage level is $V_{cc}$ and corresponds to logic one and the second voltage level is $V_{ss}$ and corresponds to logic zero.

16. A static random access memory as set forth in claim 15, wherein the means for driving the local wordlines to the first voltage level include a tristateable driver.

17. A static random access memory as set forth in claim 16, wherein the means for driving the bit lines to a second voltage level include a transistor switch for connecting the bit line to the second voltage level.

18. A static random access memory as set forth in claim 15, and further comprising transistors connected between the bit lines and voltage sources for providing transistor loads on the bits lines, the transistor loads for the bit lines being used for connecting the wordlines to a proportion of the first voltage level.

19. A static random access memory as set forth in claim 13, wherein the means for connecting the bit lines to the wordlines for sharing charge between the bit lines and the wordlines include,
a charge transmission line;
a transmission gate between a bit line and the charge transmission line; and
a transmission gate between the charge transmission line and a wordline.

20. A static random access memory as set forth in claim 19, wherein the means for driving the wordlines to the first voltage level include a tristateable driver connected to the charge transmission line.

21. A static random access memory as set forth in claim 20, wherein the transmission gate between a bit line and the charge transmission line includes complementary p and n channel transistors.

22. A static random access memory as set forth in claim 21, wherein the bit line is a complementary bit line from a pair of bit lines.

* * * * *